(12) United States Patent
Wang

(10) Patent No.: US 6,331,332 B1
(45) Date of Patent: Dec. 18, 2001

(54) PROCESS FOR DEPOSITING DIAMOND-LIKE CARBON FILMS BY CATHODIC ARC EVAPORATION

(76) Inventor: Da-Yung Wang, 4th Floor, 295-2, Da-Jing Street, Taichung (TW)

( * ) Notice: Subject to any disclaimer, the term of this patent is extended or adjusted under 35 U.S.C. 154(b) by 0 days.

(21) Appl. No.: 09/434,139

(22) Filed: Nov. 5, 1999

(51) Int. Cl.$^7$ ....................................................... H05H 1/24
(52) U.S. Cl. ............... 427/576; 427/249.18; 427/249.19; 427/249.7; 427/250; 427/255.23; 427/255.36; 427/255.394; 427/255.395; 427/577; 427/580
(58) Field of Search .................................... 427/580, 577, 427/576, 249.7, 250, 255.23, 249.18, 249.19, 255.36, 255.394, 255.395

*Primary Examiner*—Bernard Pianalto
(74) *Attorney, Agent, or Firm*—Dougherty & Troxell

(57) ABSTRACT

In accordance with the present invention, there is provided a process for depositing diamond-like carbon (DLC) films by cathodic arc evaporation (CAE), wherein the high energy of CAE metal ions causes the cracking reaction of the hydrocarbon gases fed into the vacuum reaction chamber and then results in the deposition of DLC films having high hardness and lubrication. Due to the metallic constituents doped in the DLC films, the films also have good toughness. Moreover, prior to the feeding of hydrocarbon gases for the DLC deposition, the same metal arc source may deposits one or more interlayers of metal, metal nitride, or metal carbide on the substrate so as to further enhance the adhesion of the DLC films to be deposited.

15 Claims, 1 Drawing Sheet

PROCESS FOR DEPOSITING DIAMOND-LIKE CARBON FILMS BY CATHODIC ARC EVAPORATION

FIELD OF THE INVENTION

The present invention relates to a process for depositing diamond-like carbon films by cathodic arc evaporation, and especially to a combined physical vapor deposition process developed from the core technique about cathodic arc evaporation. That is, it involves a process that comprises a physical vapor deposition process for depositing an interlayer and a plasma enhanced chemical vapor deposition process for depositing the diamond-like carbon films.

BACKGROUND OF THE INVENTION

Due to the high hardness, extremely low electrical conductivity, low frictional coefficient, and low chemical affinity of diamond-like carbon (DLC) films, they have been widely used in the applications in which low wear and anti-corrosion are required, such as semiconductor industry and wear resistant mechanical components.

The microstructure of DLC films is non-crystalline, in which both $sp^2$ and $sp^3$ bondings exist. The DLC films can be categorized into two types: one is hydrogenated DLC film and the other is non-hydrogenated DLC film.

The hydrogenated DLC film is usually obtained by means of cracking of hydrocarbon gases, such as plasma enhanced chemical vapor deposition (PECVD), hot filament chemical vapor deposition (HFCVD), or laser ablation. The non-hydrogenated DLC film is obtained by, for instance, magnetron sputtering, electron beam evaporation, or cathodic arc evaporation (CAE). It is noted that CAE can achieve high ionization and control the kinetic energy of ions to realize a DLC film having high hardness.

The primary disadvantages of the DLC films made by the above methods are the high internal stress and poor adhesion and thus the deposit thickness is as low as 0.2 to 1.0 micron, thereby resulting in ineffective application in mechanical dies or components.

In order to overcome the problem, several methods have been proposed. Franceschini, et al. (Applied Physics Letters, vd 60, No. 26, (1992) 3229–3231) incorporated nitrogen into hydrogenated DLC films to relief the internal stress and this improved to some extent. Falabella, et al. (U.S. Pat. No. 5,474,816, Dec. 1995) proposed a method for depositing DLC films by CAE with a graphite target, wherein, as disclosed in the patent, a metal was incorporated as an interlayer or nitrogen was added to the DLC films in order to reduce the internal stress. However, two or more target materials have to be provided in the same evaporation system according to this method. D. P. Monagham, et al. (Surf and Coat Technology, 60 (1993) 525–530) proposed a process of PECVD combined with magnetron sputtering to produce a DLC film comprising a metal interlayer and impurities, the advantage of which is a low temperature combination of PVD and PECVD for the DLC production. However, for the sake of its limited ionization energy of asymmetrical magnetron sputtering system, the hardness of the film thus obtained is between that of metal nitrides and that of conventional DLC, and the deposition rate is also low.

The other related prior arts are, for example, disclosed in the patents U.S. Pat. No. 5,401,543 issued to O'Neill, et al. (March 1995), U.S. Pat. No. 5,653,812 issued to Salter Richy Leonard, et al. (August 1997), U.S. Pat. Nos. 5,725, 573 and 5,731,095 issued to Lankford Jr. James, et al. (March 1998), U.S. Pat. No. 5,799,549 issued to Decker, et al. (September 1998), U.S. Pat. No. 5,763,087 issued to Falabella, et al. (June 1998), and W.O. 9810115 issued to Brown David, et al. (March 1998), as well as those described by S. Prawer, K. W. Nugent, et al. (Diamond and Related Materials, 5 (1996) 433–438) and D. G. McCulloch, S. Prawer, et al. (Physics Review B, 50 (1994) 5907–5917). They are also incorporated herein by reference.

The foregoing patents and documents reflect the state of the art of which the applicant is aware and is tendered with the view toward discharging the applicant's acknowledged duty of candor in disclosing information that may be pertinent in the examination of this application. It is respectfully stipulated, however, that these patents do not teach or render obvious, singly or when considered in combination, the applicant's claimed invention.

SUMMARY OF THE INVENTION

Figure 1A:
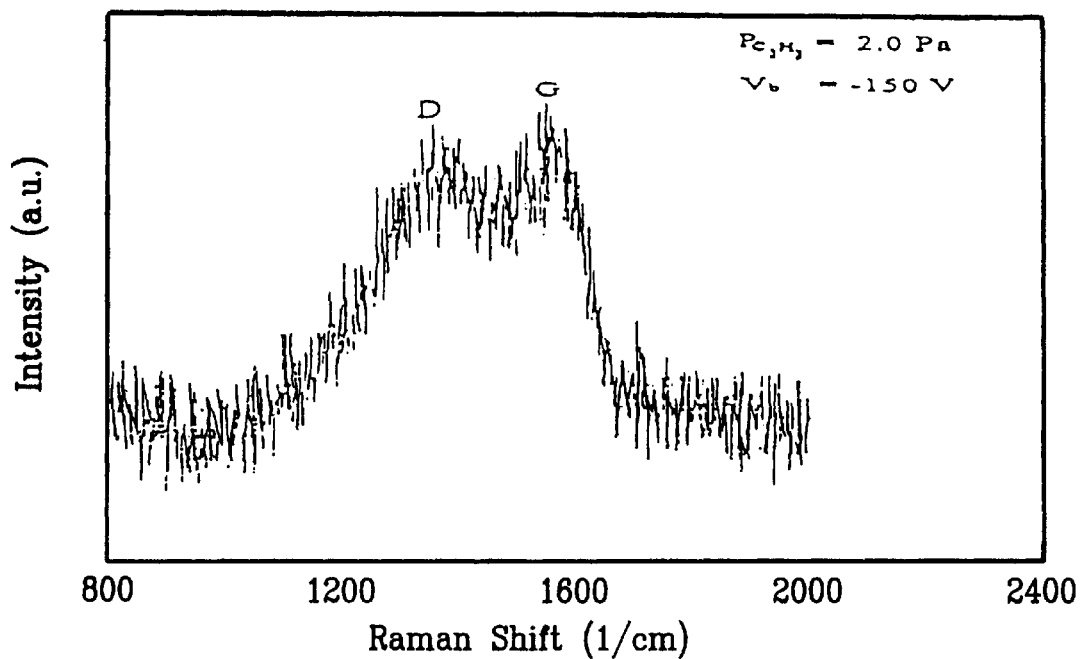
FIG. 1a is a graph showing the Raman spectra in a film deposited according to the present invention.

Accordingly, the inventor has thoroughly studied the process for depositing diamond-like carbon films by cathodic arc evaporation in order to improve the conventional techniques and achieve a higher industrial utility.

It is a primary object of the present invention to provide a process for depositing diamond-like carbon films by cathodic arc evaporation. The adhesion of the DLC films produced thereby is enhanced and the residual stress of the films is reduced.

It is a further object of the present invention to increase the hardness of the DLC films thus produced to fulfill industrial requirements.

In accordance with one aspect of the present invention, there is provided a process for depositing diamond-like carbon films by cathodic arc evaporation, wherein, during the DLC deposition by CAE, the high energy plasma provided by a metal arc source of high ionization rate causes the cracking and depositing reactions of the hydrocarbon gases fed into the vacuum reaction chamber, and a DLC film doped with metal is thus formed on the substrate. Moreover, various DLC films doped with metal having different mechanical properties can be readily obtained through the adjustment and/or selection of the electrical bias on the substrate, the working pressure, the reaction gases, and/or the target materials of arc source.

In accordance with another aspect of the present invention, during the CAE, the metal arc source can previously deposit one or more interlayers of metal, metal nitride, or metal carbide on the substrate so as to further enhance the adhesion of the DLC films to be deposited.

In accordance with another aspect of the present invention, during the cracking and depositing reactions of the hydrocarbon gases, a dopant, such as nitrogen atoms, is introduced into the vacuum reaction chamber so as to enhance the hardness of the DLC films.

DETAILED DESCRIPTION OF THE PREFERRED EMBODIMENT

The present invention will be better understood with reference to the detailed description and example below.

During the DLC deposition by CAE, the high energy plasma provided by a metal arc source of high ionization rate causes the cracking and depositing reactions of the hydrocarbon gases (e.g. $CH_4$ or $C_2H_2$) fed into the vacuum reaction chamber. A DLC film doped with the same metal as cathodic arc source is thus formed on the substrate. Moreover, various DLC films doped with metal having different mechanical properties can be readily obtained through the adjustment and/or selection of the electrical bias on the substrate, the working pressure, the reaction gases, and/or the target materials of arc source.

Furthermore, the metal arc source can deposit one or more interlayers of metal, metal nitride, or metal carbide on the substrate before the hydrocarbon gases are fed in for the cracking and depositing reactions. Therefore, the DLC films will be deposited on the interlayer rather than directly on the substrate. The adhesion of the DLC films can be accordingly enhanced.

The partial pressure of the hydrocarbon gases that are fed into the vacuum reaction chamber can be between 0.5 Pa and 5.0 Pa. Adequate parameters about the electrical bias on the substrate are advantageous to the formation of a desired interlayer, such as chromium (Cr) or titanium (Ti) interlayer. The bias generally ranges from —100 V to –300 V and it can be provided by a DC, pulsed, or RF power supply. The metal to be doped within the DLC film can be the one that will form a metal nitride or carbide, e.g. chromium, titanium, or zirconium, so as to enhance the toughness of the DLC films. The metal arc source can be a random arc source, controlled arc source, or filtered arc source.

Various DLC films with different microstructures and mechanical properties can be readily obtained through the control of the electrical bias on the substrate and the adjustment of the partial pressure of hydrocarbon gases. The hardness of the films, for example, can be varied from Hv 1800 to Hv 4200 by means of the deposition parameter adjustment mentioned above.

A preferred embodiment of the present invention described below illustrates the processing parameters in detail and a DLC film including metal is formed.

EXAMPLE

By means of CAE with Cr metal as the cathodic target material, a DLC film was deposited on a substrate while $C_2H_2$ was excited and cracked. The processing parameters are listed in Table 1.

TABLE 1 the processing parameters for depositing the DLC film by CAE

| Parameter | Value |
|---|---|
| Working pressure (Pa) | 2.0 |
| Arc source current (A) | 70 |
| Bias on substrate (V) | −150 |
| $I_D/I_G$* | 0.97 |
| Ramon G band location ($cm^{-1}$) | 1550 |
| Film hardness ($Hv_{25}$) | 3824 |

*The intensity ratio of Raman shifts

As the reaction gas ($C_2H_2$) with the working pressure of 2.0 Pa was fed into the vacuum reaction chamber and the electrical bias of –150 V was applied on the substrate, a DLC film was deposited thereon.

Figure 1B:
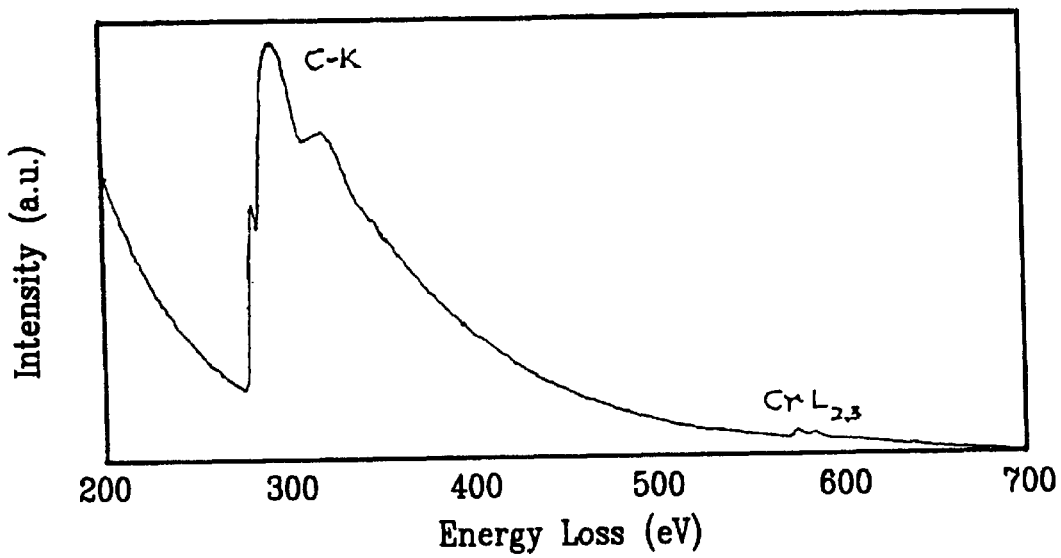
FIG. 1b is a graph showing an EELS analysis of a film deposited according to the present invention.

The film thus deposited was analyzed. FIGS. 1a and 1b show the Raman spectra and EELS analysis results. It depicts that the deposited carbon film is rich in the non-crystalline network of characteristic $Sp^2$ and $sp^3$ hybrid bonds. The hardness of the film was measured to be about $Hv_{25}$ 3824, which is much higher than metal nitrides.

Such a DLC film including Cr possesses good adhesion to substrate and reduced residual stress especially with the aid of one or more interlayers of metal, metal nitride, or metal carbide formed on the substrate before the formation of DLC film. For example, in a pin-on-disk wearing test in which the film deposited according to this example is wore by a 52100 bearing steel ball under a load of 20 N, no film rupture was observed after a wearing distance of more than 3500 m. Furthermore, the frictional coefficient of the film is only 0.02 to 0.04, which is much lower than 0.3 to 0.5 of a titanium nitride film produced during a conventional PVD surface treatment. Accordingly, the films producing by the process of the present invention can be effectively applied as a protective coating on anti-wear mechanical components or dies.

As an alternative to the example, during the CAE, gases other than the used hydrocarbon gases, e.g. nitrogen ($N_2$), may be fed into the vacuum reaction chamber along with the hydrocarbon gases so that the doping gases will also take part in the cracking reaction. Therefore, the nitrogen atoms can be introduced as a dopant to the DLC film and thus modify the degree of freedom of the $Sp^3$ bonding in the formed DLC film, which can be confirmed by the different intensity ratios of Raman shifts of the films. Thus, the addition of a doping gas can improve the hardness of the DLC films.

In summary, the DLC film produced by the process according to the present invention have improved hardness, good adhesion and toughness as well as reduced residual stress after forming. The process can be effectively used to deposit DLC films as a coating required in various applications, such as semiconductor, optics, and opto-electron industries and mechanical anti-wear components. The process for depositing diamond-like carbon films by cathodic arc evaporation according to the present invention is new and significantly pushes the DLC films to a higher industrial utility.

While the invention has been taught with specific reference to the embodiment, someone skilled in the art will recognize that changes can be made in form and detail without departing from the spirit and the scope of the invention. The described embodiment is to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A process for depositing a diamond-like carbon (DLC) film on a substrate comprising the steps of:
    a) providing a vacuum reaction chamber and placing the substrate therein;
    b) placing a metal arc source in the vacuum chamber;
    c) forming an electrical bias on the substrate of between −100 V and −300 V;
    d) feeding hydrocarbon gases into the vacuum reaction chamber with a partial pressure of between 0.5 Pa and 5.0 Pa; and,
    e) carrying out a cathodic arc evaporation (CAE) process to deposit a DLC film doped with metal from the metal arc source on the substrate.

2. The process for depositing a diamond-like carbon (DLC) film of claim 1 wherein the hydrocarbon gas comprises $C_2H_2$.

3. The process for depositing a diamond-like carbon (DLC) film of claim 1 wherein the hydrocarbon gas comprises $CH_4$.

4. The process for depositing a diamond-like carbon (DLC) film of claim 1 wherein the metal arc source comprises a filtered arc source.

5. The process for depositing a diamond-like carbon (DLC) film of claim 1 wherein the metal arc source comprises a controlled arc source.

6. The process for depositing a diamond-like carbon (DLC) film of claim 1 wherein the metal arc source comprises a random arc source.

7. The process for depositing a diamond-like carbon (DLC) film of claim 1 comprising the additional step of depositing an interlayer on the substrate prior to feeding the hydrocarbon gases into the vacuum reaction chamber to enhance the adhesion of the DLC film.

8. The process for depositing a diamond-like carbon (DLC) film of claim 7 wherein the interlayer comprises a metal interlayer.

9. The process for depositing a diamond-like carbon (DLC) film of claim 7 wherein the interlayer is a metal carbide interlayer.

10. The process for depositing a diamond-like carbon (DLC) film of claim 7 wherein the interlayer is a metal nitride interlayer.

11. The process for depositing a diamond-like carbon (DLC) film of claim 1 wherein the DLC film is doped with a metal selected from the group consisting of chromium, titanium and zirconium.

12. The process for depositing a diamond-like carbon (DLC) film of claim 1 comprising the additional step of introducing nitrogen into the vacuum reaction chamber during the cathodic evaporation process to enhance the hardness of the DLC film.

13. The process for depositing a diamond-like carbon (DLC) film of claim 1 wherein the electrical bias is applied to the substrate by a direct current (DC) power supply.

14. The process for depositing a diamond-like carbon (DLC) film of claim 1 wherein the electrical bias is applied to the substrate by a pulsed power supply.

15. The process for depositing a diamond-like carbon (DLC) film of claim 1 wherein the electrical bias is applied to the substrate by an RF power supply.

* * * * *